(12) United States Patent
Koberg

(10) Patent No.: US 9,238,359 B2
(45) Date of Patent: Jan. 19, 2016

(54) METHOD AND APPARATUS FOR ATTACHING FLEXOGRAPHIC AND METAL BACK PLATES ON AN IMAGING CYLINDER

(71) Applicant: Esko-Graphics Imaging GmbH, Ghent (BE)

(72) Inventor: Jörg Koberg, Itzehoe (DE)

(73) Assignee: ESKO-GRAPHICS IMAGING GMBH, Itzehoe (DE)

( * ) Notice: Subject to any disclaimer, the term of this patent is extended or adjusted under 35 U.S.C. 154(b) by 0 days.

(21) Appl. No.: 13/804,909

(22) Filed: Mar. 14, 2013

(65) Prior Publication Data

US 2014/0261035 A1 Sep. 18, 2014

(51) Int. Cl.
| | |
|---|---|
| *B41F 27/00* | (2006.01) |
| *B41F 27/12* | (2006.01) |
| *G03F 7/24* | (2006.01) |
| *B41L 29/02* | (2006.01) |
| *B41F 27/06* | (2006.01) |

(52) U.S. Cl.
CPC .............. *B41F 27/1212* (2013.01); *G03F 7/24* (2013.01); *B41F 27/005* (2013.01); *B41F 27/06* (2013.01); *B41L 29/02* (2013.01)

(58) Field of Classification Search
CPC ......... B41F 27/005; B41F 27/06; B41N 6/00; B41L 29/02; B41L 29/00
USPC ...................................................... 101/389.1
See application file for complete search history.

(56) References Cited

U.S. PATENT DOCUMENTS

| | | | | |
|---|---|---|---|---|
| 2,788,743 | A * | 4/1957 | Schwerin | 101/389.1 |
| 3,126,825 | A * | 3/1964 | Tofano | 101/415.1 |
| 3,670,646 | A * | 6/1972 | Welch, Jr. | 101/389.1 |
| 3,820,460 | A * | 6/1974 | McElreath | 101/389.1 |
| 3,824,927 | A * | 7/1974 | Pugh et al. | 101/378 |
| 5,136,945 | A * | 8/1992 | Kawazoe | 101/389.1 |
| 5,505,125 | A * | 4/1996 | Kapolnek | 101/23 |
| 5,716,048 | A * | 2/1998 | Morrissette | 101/389.1 |
| 5,758,874 | A * | 6/1998 | Morrissette | 101/389.1 |
| 5,832,831 | A * | 11/1998 | Boyle et al. | 101/375 |
| 5,865,433 | A | 2/1999 | Morrissette | |
| 6,267,054 | B1 * | 7/2001 | Lopes | 101/389.1 |
| 7,086,332 | B2 * | 8/2006 | Wegter | 101/389.1 |
| 7,165,492 | B2 | 1/2007 | Koberg et al. | |
| 7,997,198 | B2 | 8/2011 | Koberg et al. | |
| 8,087,440 | B2 * | 1/2012 | Preisner et al. | 156/447 |
| 8,100,054 | B2 | 1/2012 | Koberg | |
| 2005/0120898 | A1 * | 6/2005 | Lovenstein et al. | 101/389.1 |

OTHER PUBLICATIONS

U.S. Appl. No. 13/870,903, filed Apr. 25, 2013, Jörg Koberg.

* cited by examiner

*Primary Examiner* — Jill Culler
(74) *Attorney, Agent, or Firm* — RatnerPrestia

(57) ABSTRACT

Apparatus and methods for attaching flexible or magnetic plates onto an imaging cylinder are provided. A drum apparatus of an imaging device includes an imaging cylinder having an outer surface and a magnetic foil attachable to the outer surface of the imaging cylinder. In a configuration with the magnetic foil attached to the outer surface of the imaging cylinder, at least one metal back plate can be attached to the imaging cylinder via magnetic coupling to the magnetic foil. In a configuration without the magnetic foil attached to the outer surface of the imaging cylinder, at least one flexographic plate can be attached to the imaging cylinder.

19 Claims, 15 Drawing Sheets

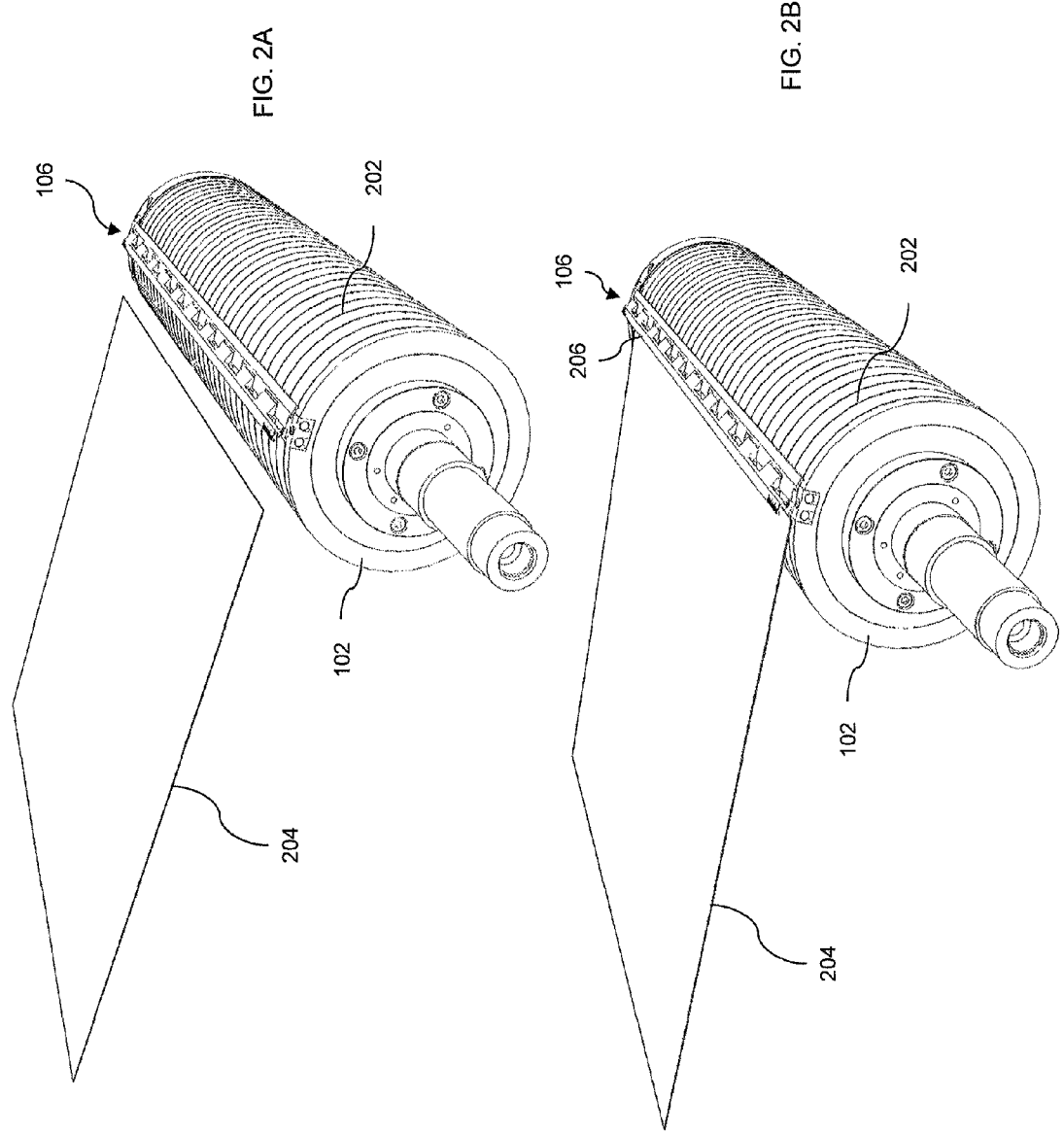

METHOD AND APPARATUS FOR ATTACHING FLEXOGRAPHIC AND METAL BACK PLATES ON AN IMAGING CYLINDER

FIELD OF THE INVENTION

The present invention relates to the field of printing and, more particularly, to methods and apparatus for fastening flexographic plates and metal back plates onto imaging cylinders.

BACKGROUND OF THE INVENTION

Computer-to-plate (CTP) is an imaging technology used in printing processes, in which image data is output directly from a computer to a printing plate by exposing the printing plate to light energy according to the image data. A printing plate is positioned on an imaging cylinder, e.g., the cylinder (also called a drum) of an external drum imaging device. As the cylinder rotates around its axis, an image head moves in the axial direction and focuses one or more laser beams modulated with image data onto an ablatable layer of the plate to ablate a pattern.

In general, printing plates may include any type of plate that is ablatable by light energy. Examples of printing plates include flexographic plates (sometimes referred to as "flexo plates") and metal back plates (sometimes referred to as "letterpress plates") that include a photopolymer material.

There are generally three different types of cylinder devices currently available for CTP imagers, dependent upon the types of printing plates being used. These devices include vacuum-based cylinder devices, magnetic cylinder devices and magnetic vacuum-based cylinder devices.

Conventional vacuum-based cylinder devices may be used to mount flexographic plates. They are not typically configured to mount metal back plates (such as letterpress plates). These devices include a cylinder coupled to a vacuum system. Flexographic plates are mounted to the cylinder by applying suction via the vacuum system.

Conventional magnetic cylinder devices may be used to mount metal back plates (such as letterpress plates). They are not typically configured to mount flexographic plates. The magnetic cylinder device typically includes a metal cylinder (such as aluminum) having a plurality of permanent magnets formed in the surface of the cylinder. Metal back plates are mounted to the cylinder by magnetic coupling via the permanent magnets.

Conventional magnetic vacuum-based cylinder devices may be used to mount metal back plates (such as letterpress plates) and flexographic plates. In addition to a metal cylinder having permanent magnets in the surface of the cylinder, the device includes a vacuum system coupled to the cylinder. For flexographic plates, suction is applied via the vacuum system. For metal back plates, the permanent magnets are used to magnetically couple the plates to the cylinder. When using flexographic plates on the cylinder, however, the cylinder surface (which include permanent magnets) may cause problems in an image of the flexographic plate. For example, the laser beam of a CTP imager may be reflected from the cylinder surface and may affect the image of the flexographic plate.

In general, vacuum-based cylinder devices are less expensive to manufacture than magnetic cylinder devices and magnetic vacuum-based cylinder devices. Magnetic vacuum-based cylinder devices are typically the most expensive to manufacture. The type of cylinder included with a CTP imager typically depends on the type of printing plates that will be used by a customer. For example, if only flexographic plates are to be used, the imager may be equipped with a vacuum-based cylinder device. If a user only uses metal back plates, the imager may be equipped with a magnetic cylinder device. If a user uses both metal and flexographic plates, the imager may be equipped with a magnetic vacuum-based cylinder device.

Another option for using both flexo and metal back plates on the same imager, aside from using magnetic vacuum cylinders, is to change the drums in the imager so as to use a vacuum-based cylinder device for flexographic plates and a magnetic cylinder device for metal back plates. However, this requires two drums, which is more costly than a single drum system, and may impact productivity because of the time needed to change the drums. Accordingly, there is a need for more cost effective apparatus and methods for permitting both flexo and metal back printing plates to be used on the same imager.

SUMMARY OF THE INVENTION

One aspect of the present invention comprises a drum apparatus of an imaging device, the drum apparatus comprising a non-magnetic imaging cylinder having an outer surface; and a magnetic foil attached to the outer surface of the imaging cylinder. The imaging cylinder with the magnetic foil attached thereto is configured to retain at least one metal back plate on the imaging cylinder via magnetic coupling of the plate to the magnetic foil. The drum apparatus may have a first configuration in which the magnetic foil is releasably attached to the outer surface of the imaging cylinder, and a second configuration in which the magnetic foil is not attached to the outer surface of the imaging cylinder and in which the imaging cylinder is configured to receive at least one flexographic plate on its outer surface. In one embodiment, the drum apparatus comprises a clamping device coupled to the imaging cylinder operable to releasably clamp the magnetic foil or the at least one flexographic plate to the outer surface of the imaging cylinder.

Another aspect of the present invention is a method for retrofitting a non-magnetic imaging cylinder to receive at least one metal back plate. The method comprises the steps of attaching a magnetic foil on an outer surface of the imaging cylinder; and magnetically coupling the at least one metal back plate to the magnetic foil on the imaging cylinder. The method may further comprise the steps of detaching the magnetic foil from the outer surface of the imaging cylinder; and coupling at least one flexo plate to the imaging cylinder.

BRIEF DESCRIPTION OF THE DRAWINGS

The invention may be understood from the following detailed description when read in connection with the accompanying drawing. It is emphasized that, according to common practice, various features of the drawing may not be drawn to scale. On the contrary, the dimensions of the various features may be arbitrarily expanded or reduced for clarity. Moreover, in the drawing, common numerical references are used to represent like features. Included in the drawing are the following figures:

FIGS. 2A, 2B, 2C, 2D and 2E are isometric view diagrams of a flexographic plate and an exemplary drum apparatus, illustrating exemplary steps for attachment of a flexographic plate to the drum apparatus, according to aspects of the present invention;

DETAILED DESCRIPTION OF THE INVENTION

Aspects of the present invention include apparatus and methods for attaching both metal back plates and flexible plates onto non-metal imaging cylinders, such as for use in digital imagers or printers. An exemplary drum apparatus of an imaging device includes an imaging cylinder and a magnetic foil attachable to an outer surface of the imaging cylinder. With the magnetic foil attached to the outer surface of the imaging cylinder, at least one metal back plate may be magnetically coupled to the magnetic foil, thus releasably attaching the metal back plate to the outer surface of the imaging cylinder. Without the magnetic foil attached to the outer surface of the imaging cylinder, the outer surface of the imaging cylinder is configured to receive at least one flexographic plate.

In one embodiment, a vacuum-based cylinder may be configured to receive a suitable magnetic foil, so that both types of plates (flexographic and metal back plates) may be mounted on the imaging cylinder. The magnetic foil may be purchased along with a non-magnetic cylinder as part of a kit or the foil may be purchased separately at any time. Thus, a vacuum-based non-magnetic imaging cylinder that is configured to mount flexographic plates already in the field, can be retrofitted with the magnetic foil to convert the cylinder for use with metal back plates. By using a removable magnetic foil on a non-magnetic cylinder, a drum apparatus capable of using both flexographic and metal back plates may be provided at relatively lesser cost than using magnetic vacuum cylinders or purchasing both magnetic and non-magnetic cylinders.

Embodiments of the invention will now be described in terms of exemplary methods and apparatus corresponding to an exemplary drum imager, in particular a Cyrel® Digital Imager (CDI), and more particularly, one of various CDI imagers made by Esko-Graphics bvba of Gent, Belgium. Those in the art will understand, however, that the invention is not limited to use in connection with any particular imager embodiment.

Figure 1A:
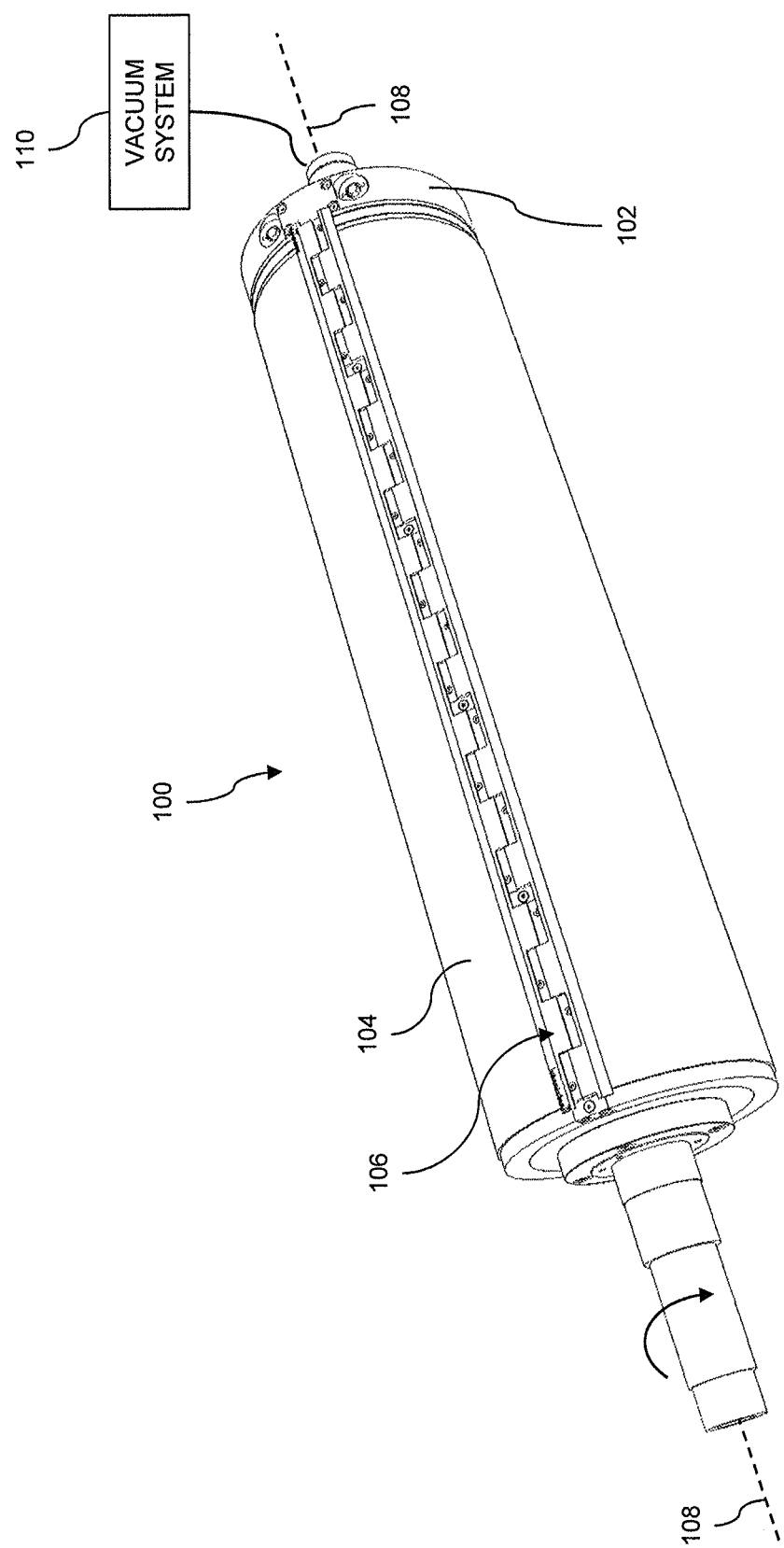
FIG. 1A is an isometric view diagram of an exemplary drum apparatus, according to aspects of the present invention.
Figure 1B:
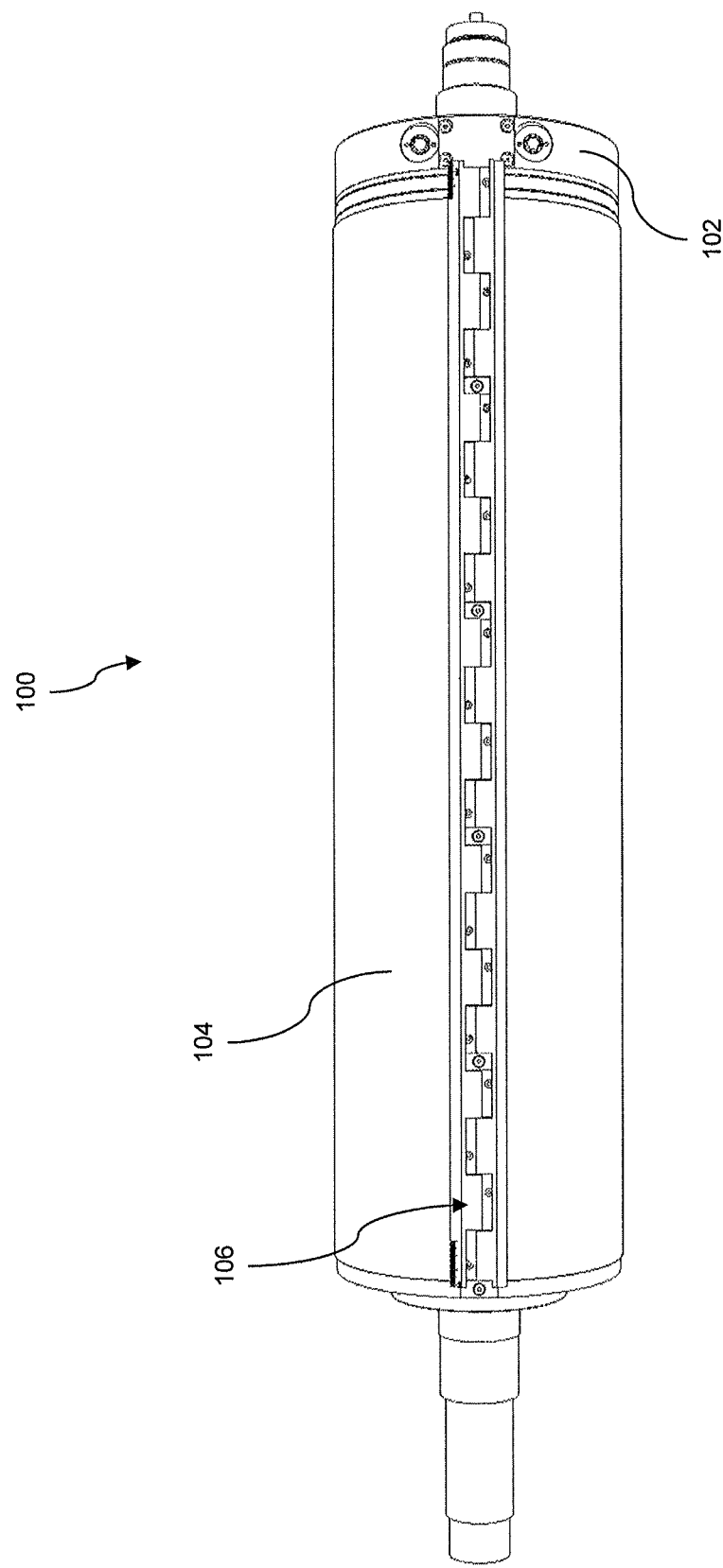
FIG. 1B is a top view diagram of the exemplary drum apparatus shown of FIG. 1A.

Referring to FIGS. 1A and 1B, FIG. 1A depicts an isometric view diagram of an exemplary drum apparatus 100, and FIG. 1B depicts a top view diagram of drum apparatus 100.

Figure 2C:
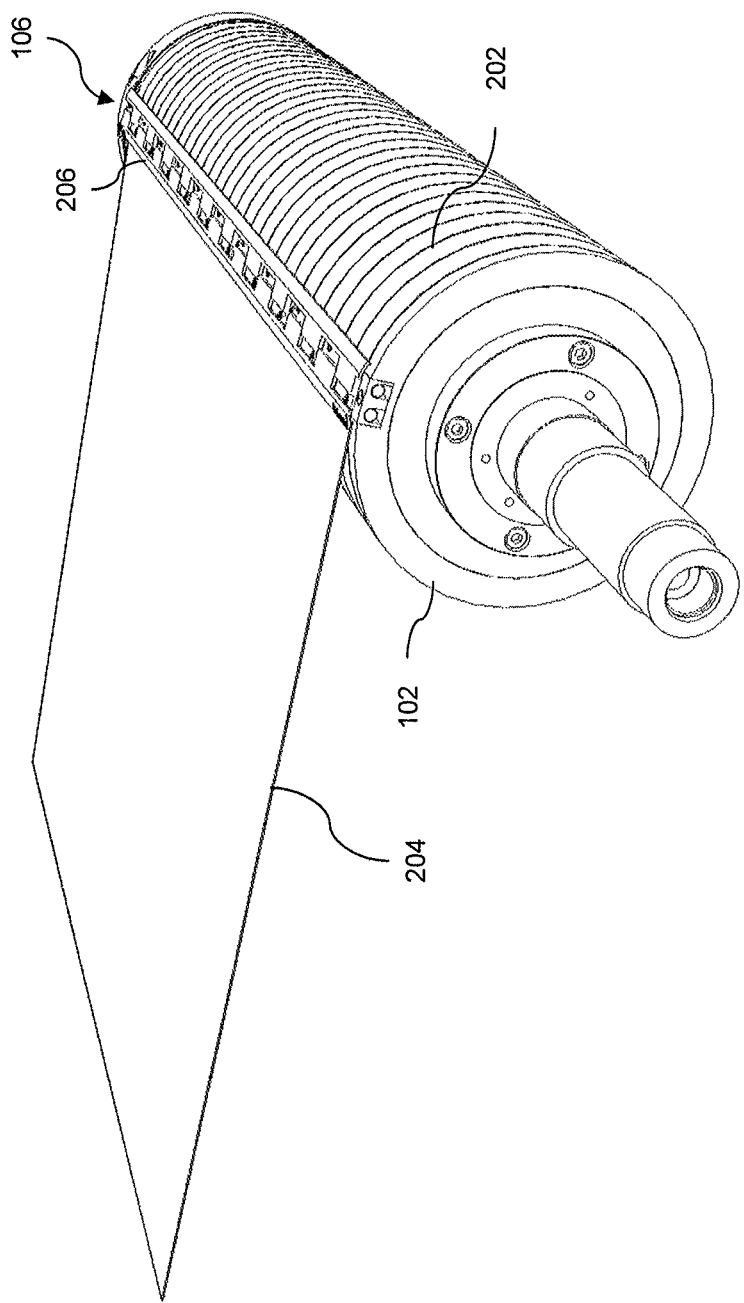

Drum apparatus 100 includes imaging cylinder 102 with magnetic foil 104 mounted thereon. Cylinder 102 is configured to rotate about axis 108. In FIGS. 1A and 1B, magnetic foil 104 is illustrated as being attached via an exemplary clamping device 106. Clamping device 106 may suitable for attaching magnetic foil 104 or flexographic plate 204 (as shown in FIG. 2A) on the outer surface of imaging cylinder 102. Exemplary clamping device 106 is described further below with respect to FIGS. 2A-2E, but the invention is not limited to any particular clamping device design.

In operation, exemplary imaging cylinder 102 is coupled to a vacuum system 110. The outer surface of imaging cylinder 102 is typically perforated such that the vacuum drawn through cylinder 102 generates suction at the surface of the imaging cylinder that releasably adheres magnetic foil 104 or flexographic plate 204 (FIG. 2A) on the outer surface of imaging cylinder 102. Exemplary imaging cylinder 102 is described further below with respect to FIGS. 2A-2E.

Figure 4:
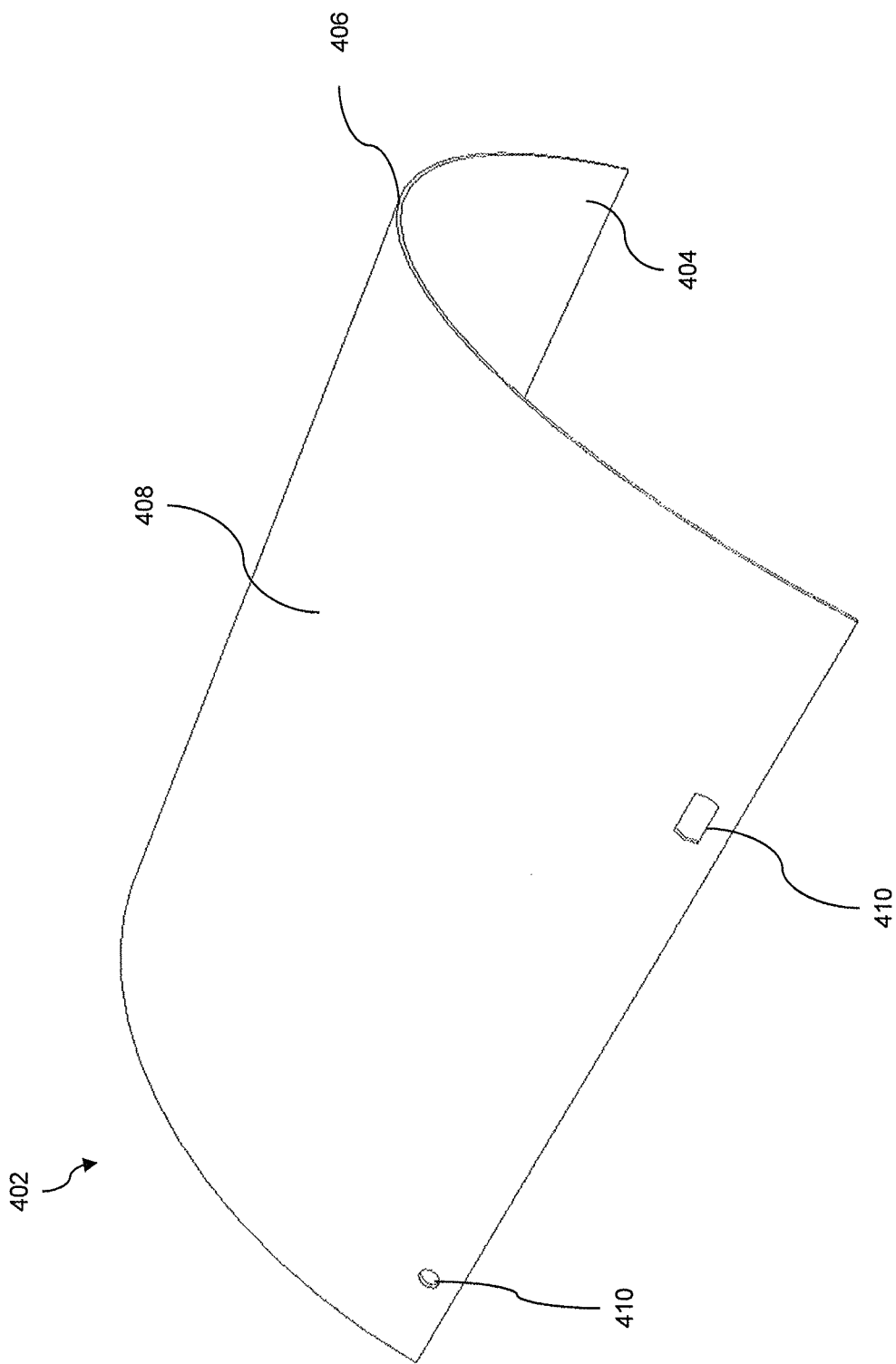
FIG. 4 is an isometric view diagram of an exemplary metal back plate, according to aspects of the present invention.

Magnetic foil 104 may include any material capable of being suitably magnetized to magnetically couple at least one metal back plate 402 (as shown in FIG. 4) to magnetic foil 104. For example, magnetic foil 104 may include magnetic particles such as unmagnetized iron or other ferromagnetic particles. A suitable magnetic foil material may be selected according to the holding force desired for magnetically attaching metal back plate 402 to magnetic foil 104. In one exemplary embodiment, magnetic foil 104 may comprise a GraviFlex® Magnetic foil 190 manufactured by Schallenkammer Magnetsysteme GmbH, which for a material thickness of 1.0 mm has a reported holding force of approximately 285 g/sqcm measured on a surface-ground metal surface with a thickness of 10 mm. The invention is not limited to any particular type or grade of magnetic foil, however. It should also be understood that although the term magnetic "foil" is used herein, the term "foil" should not be construed to refer to any particular materials of construction or thickness.

Magnetic foil 104 may comprise any material having sufficient magnetic strength to magnetically couple a metal back plate to the cylinder, and sufficiently flexible to be disposed around the outer surface of imaging cylinder 102. While in an exemplary embodiment, magnetic foil 104 has a thickness between about 0.5 mm to about 5 mm, and more preferably between about 0.8 mm to about 3.0 mm, and most preferably in 1 mm and 2 mm thicknesses, but thicknesses outside of that range may be acceptable, depending upon the application. As one of skill in the art can appreciate, relatively lesser thicknesses may be acceptable for foils having a relatively greater holding force per unit volume or for use in holding metal plates of relatively lesser relative weights, whereas relatively greater thicknesses may be acceptable for foils having relatively greater flexibility or for use on cylinders having a relatively greater diameter (and thus requiring lesser flexibility for the foil to bend around them). One of skill in the art will also appreciate that foils having a lesser relative holding strength may need to be relatively thicker in order to provide suitable holding capability. Furthermore, a foil having lesser flexibility may be pre-stressed to have a curvature more closely matching that of the drum, so that less suction, adhesive, and/or clamping force is needed to retain it around the drum.

In FIGS. 1A and 1B, magnetic foil 104 is illustrated as a single sheet which extends over the entire axial length of imaging cylinder 102 (i.e., as a full format size). According to another embodiment, magnetic foil 104 may extend over less than the entire axial length of imaging cylinder 102. Similarly, although magnetic foil 104 is illustrated as extending completely around imaging cylinder 102 in a circumferential direction, in certain embodiments, magnetic foil 104 may extend around only a portion of imaging cylinder 102 that is less than the entire circumference.

FIGS. 1A and 1B illustrate magnetic foil 104 as a single sheet. According to another embodiment, magnetic foil 104 may include a plurality of magnetic foil sheets which may be attached to various locations on imaging cylinder 102. The plurality of magnetic sheets may each have a same size or may have different sizes.

In one exemplary embodiment, magnetic foil 104 is temporarily attached to imaging cylinder 102 via vacuum system 110 and clamping device 106. According to another embodiment, magnetic foil 104 may be attached to imaging cylinder 102 via an adhesive (such as but not limited to double sided tape or adhesive tape), either with or without clamping device 106. According to another embodiment, magnetic foil 104 may be permanently attached to imaging cylinder 102 (such as via an adhesive).

In an exemplary embodiment, imaging cylinder 102 is a non-magnetic cylinder configured to mount flexographic plates 204 (FIG. 2A), but incapable of mounting metal back plates 402 (FIG. 4) without the use of the foil described herein. As described further below, magnetic foil 104 may therefore be removably attached to imaging cylinder 102 so that metal back plate 402 (FIG. 4) may be mounted to imaging cylinder 102 when configured with the foil, but the imaging cylinder retains the ability to mount flexo plates when the foil is removed.

Referring next to FIGS. 2A-2E, an exemplary method of attaching flexographic plate 204 to imaging cylinder 102 of drum apparatus 100 is shown. As shown in FIG. 2A, flexographic plate 204 is positioned in a predefined position adjacent to imaging cylinder 102 (without magnetic foil 104 attached to imaging cylinder 102), and leading edge 206 of clamping device 106 is opened. For example, flexographic plate 204 may be positioned via a loading table (not shown) of an imager, as is known by those of skill in the art.

As shown in FIG. 2B, one edge of flexographic plate 204 is aligned and positioned under leading edge 206 of clamping device 106. As shown in FIG. 2C, leading edge 206 of clamping device 106 is closed, to secure the edge of flexographic plate 204.

Figure 2E:
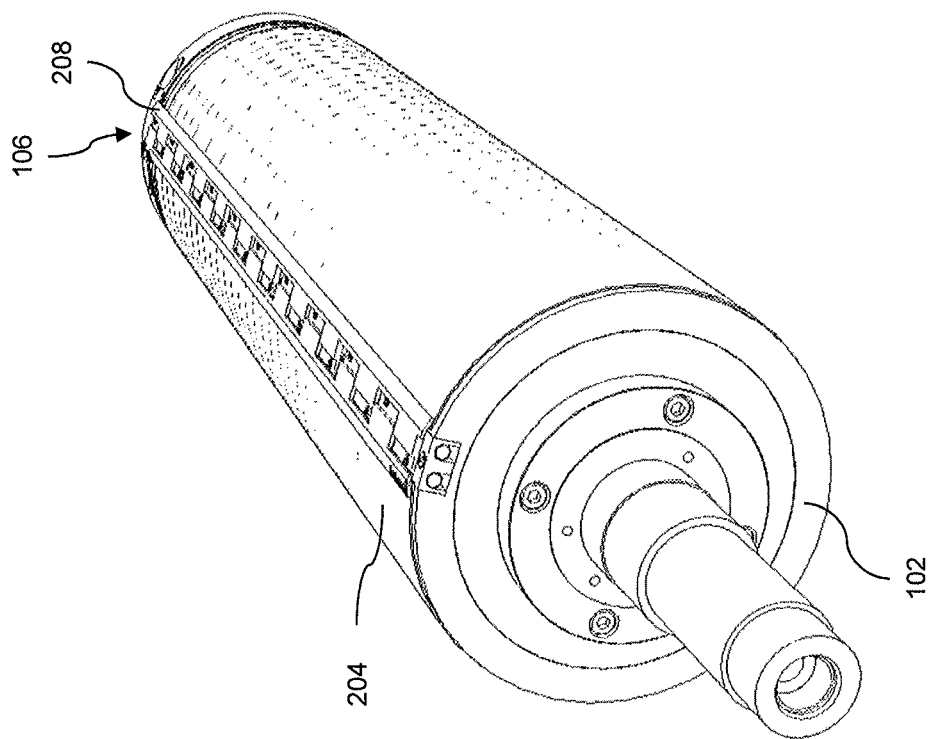
Figure 2D:
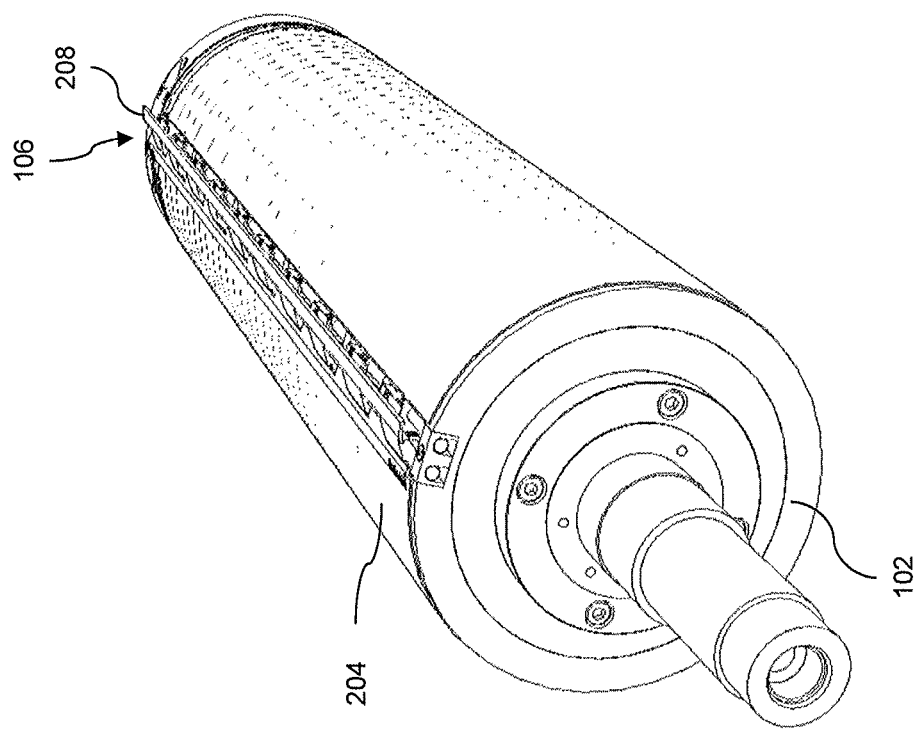

Referring to FIGS. 2A and 2D, imaging cylinder 102 includes a plurality of vacuum grooves 202. Imaging cylinder 102 includes an internal vacuum chamber (not shown), in communication with vacuum grooves 202 and vacuum system 110. In FIG. 2D, vacuum system 110 is activated, to apply suction to vacuum grooves 202. Trailing edge 208 of clamping device 106 is also opened and imaging cylinder 102 is rotated 360 degrees about axis 108 to receive the flexo plate around its circumference. Thus, as shown in FIG. 2D, flexographic plate 204 is attached around a circumference of imaging cylinder 102 and retained in part by the suction drawn through vacuum grooves 202 and on one end by the clamping device 106.

In FIG. 2E, a remaining edge of flexographic plate 204 is positioned under trailing edge 208 of clamping device 106, and trailing edge 208 is closed. In this way, the combination of clamping device 106 and suction secures flexographic plate 204 to imaging cylinder 102. Thus, when drum apparatus 100 (FIG. 1A) is configured without magnetic foil 104, drum apparatus 100 (via imaging cylinder 102) may be used to mount flexographic plate 204.

Figure 5A:
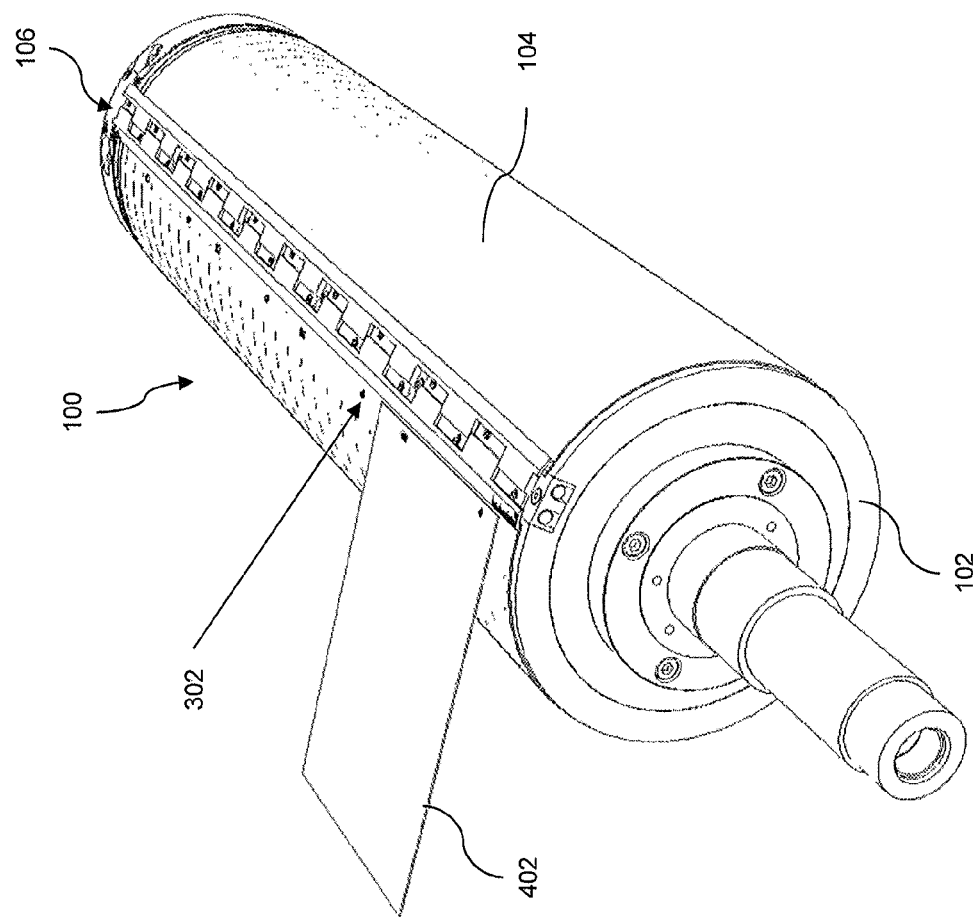
FIGS. 5A, 5B and 5C are isometric view diagrams of a metal back plate and an exemplary drum apparatus, illustrating exemplary steps for attachment of the metal back plate to the drum apparatus, according to aspects of the present invention.
Figure 5C:
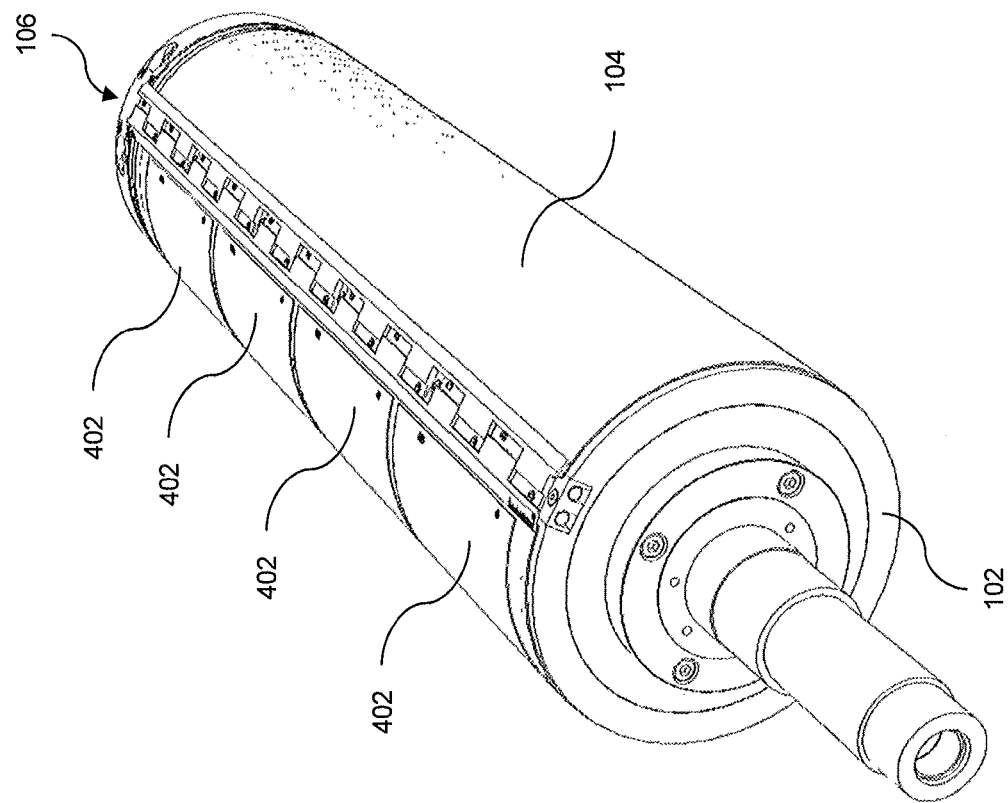

Although FIGS. 2A-2E illustrate a single flexographic plate 204, it is understood that drum apparatus 100 may be configured to attach a plurality of flexographic plates (similar to the way in which the plurality of metal back plates 402 are retained on the cylinder as shown in FIG. 5C).

Referring next to FIGS. 3A-3E, an exemplary method of attaching magnetic foil 104 to imaging cylinder 102 is shown. The exemplary method shown in these figures may be used to convert imaging cylinder 102 for use with metal back plates 402. The exemplary method shown in FIGS. 3A-3E may be performed, for example, to retrofit an existing imaging cylinder 102 to accept metal back plates 402.

Figure 3A:
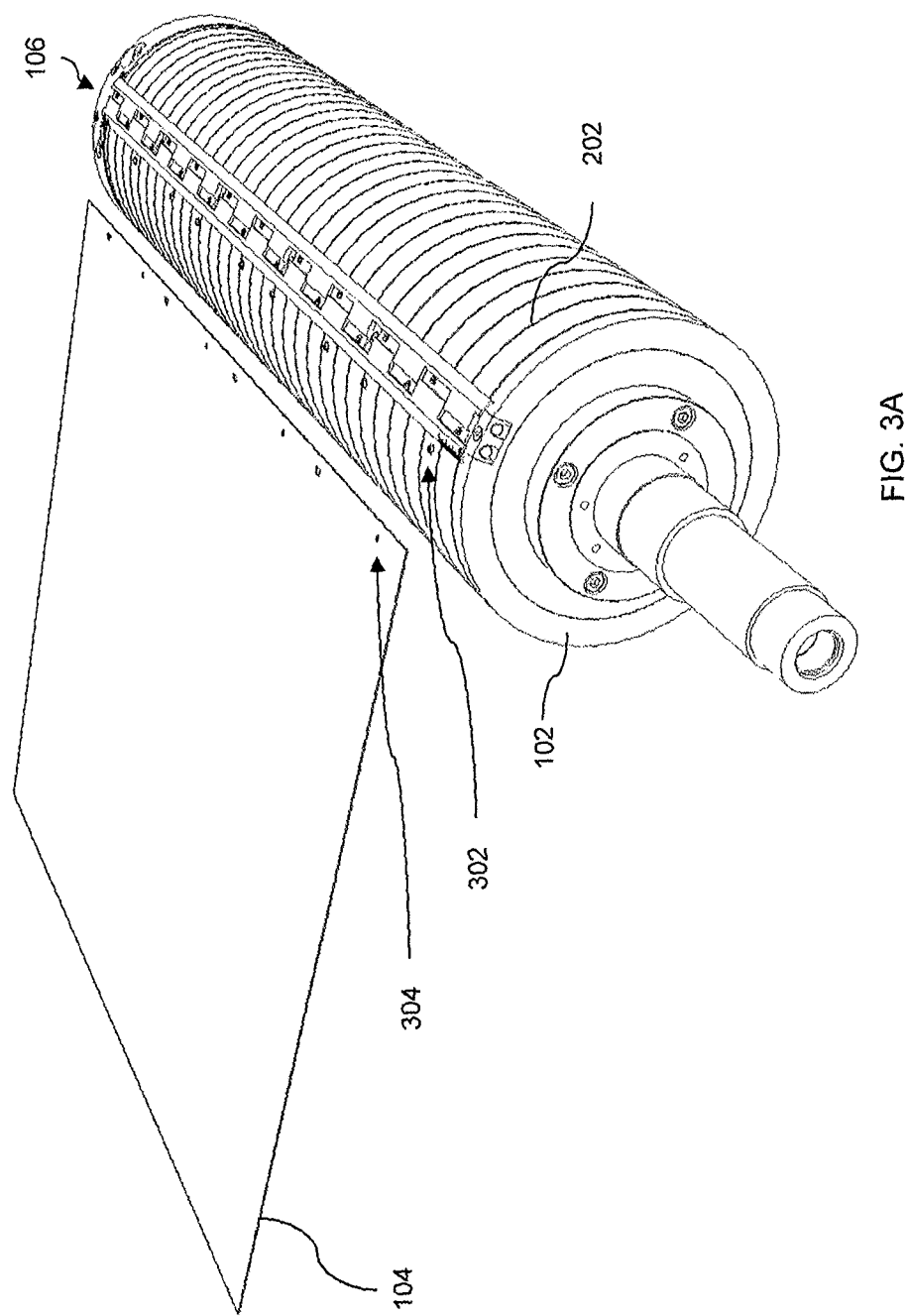
FIGS. 3A, 3B, 3C, 3D and 3E are isometric view diagrams of an exemplary drum apparatus, illustrating exemplary steps for attachment of the magnetic foil to an imaging cylinder, according to aspects of the present invention.

As shown in FIG. 3A, magnetic foil 104 is positioned in a predefined position adjacent to imaging cylinder 102, and leading edge 206 of clamping device 106 is opened. For example, magnetic foil 104 may be positioned via a loading table (not shown) of an imager, as is known to those of skill in the art for positioning flexo plates on cylinders. As shown in FIG. 3A, imaging cylinder 102 includes a plurality of register pins 302. In addition, magnetic foil 104 includes a plurality of apertures 304 corresponding to register pins 302. Although shown with such apertures in exemplary foil 104 and register pins 302 on exemplary cylinder 102, it should be understood that embodiments of the invention may be practiced with or without a registration system, including but not limited to registration systems with apertures and pins, and that embodiments using a registration system are not limited to any particular registration system design.

Figure 3B:
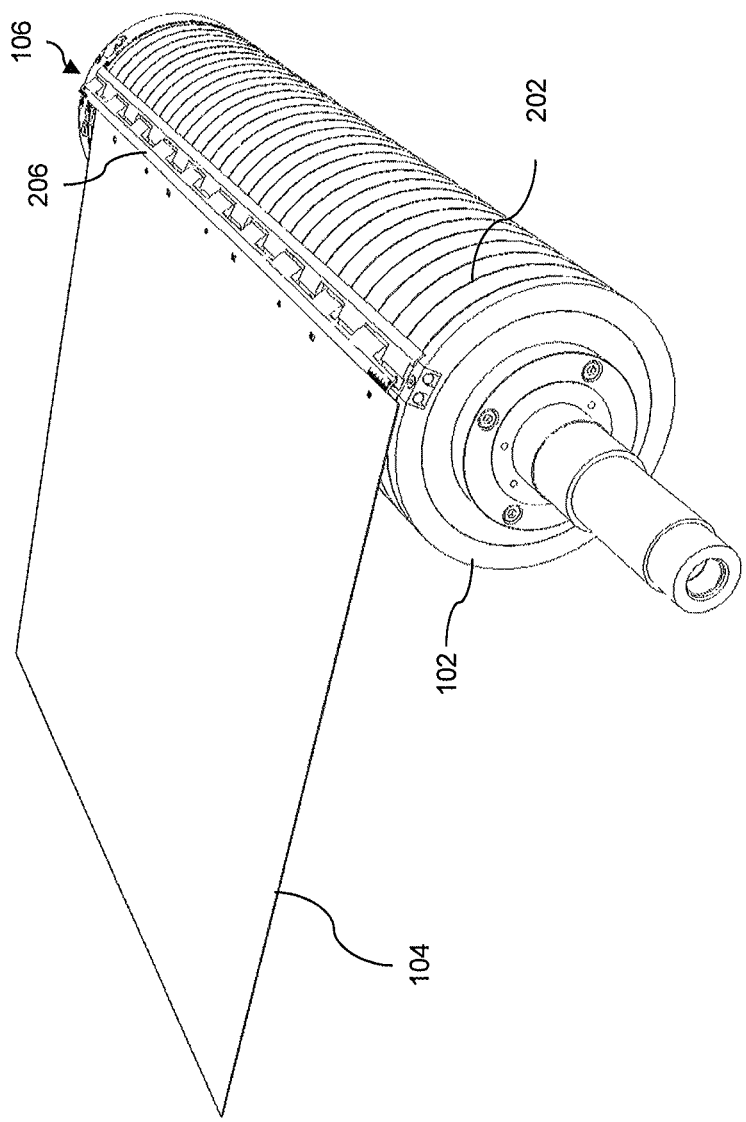
Figure 3C:
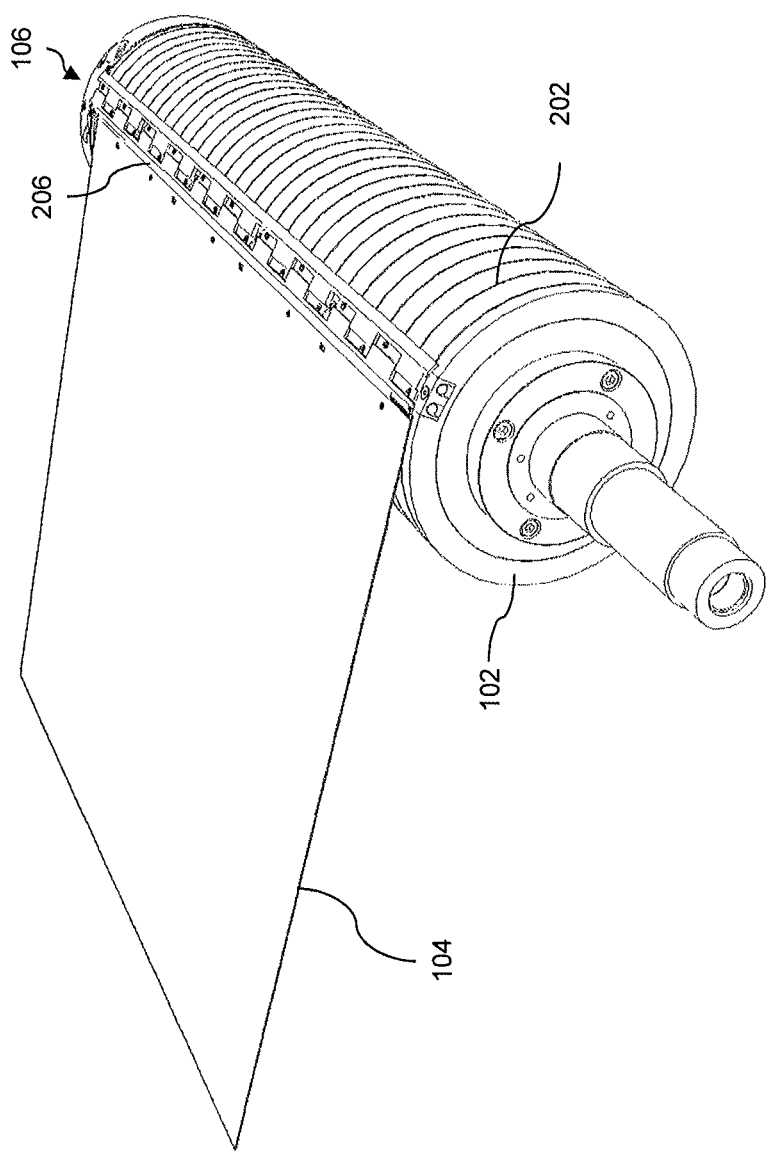

As shown in FIG. 3B, one edge of magnetic foil 104 is aligned and positioned under leading edge 206 of clamping device 106, by engaging apertures 304 in register pins 302. As shown in FIG. 3C, leading edge 206 of clamping device 106 is closed to secure the edge of magnetic foil 104 to imaging cylinder 102.

Figure 3E:
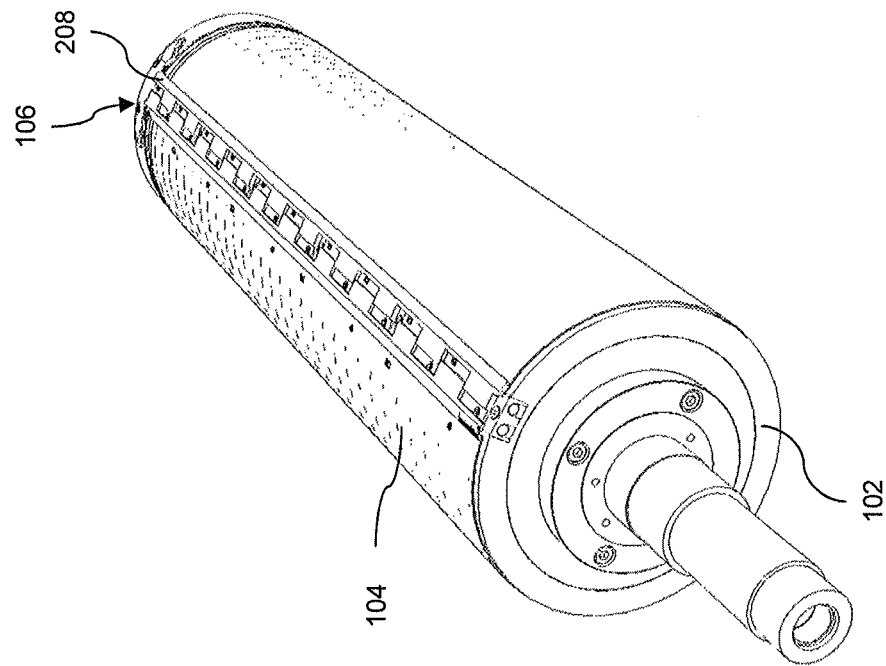
Figure 3D:
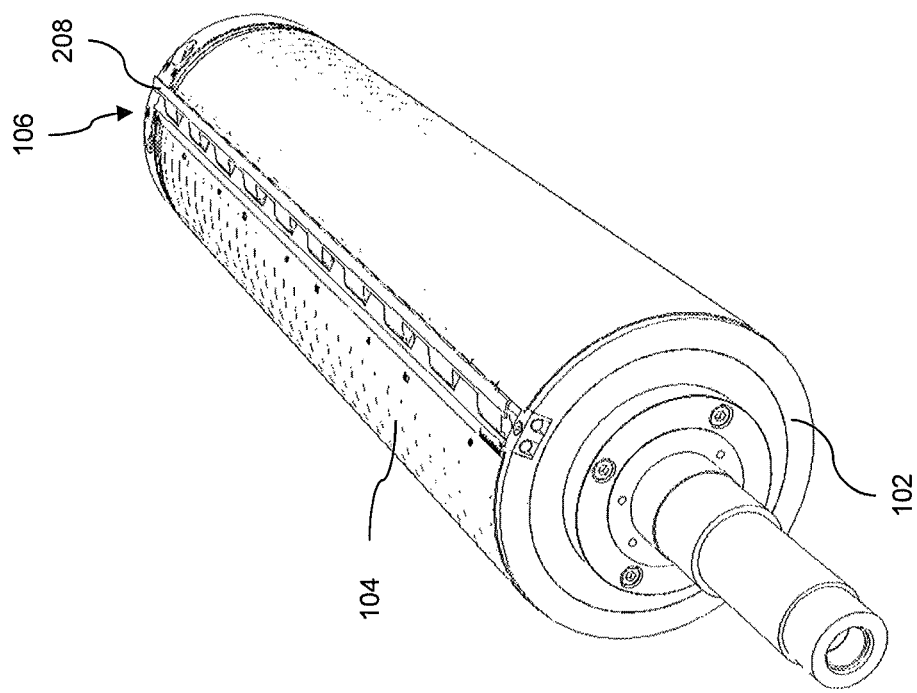

In FIG. 3D, vacuum system 110 (FIG. 1A) is activated to apply suction to vacuum grooves 202. Trailing edge 208 of clamping device 106 is also opened and imaging cylinder 102 is rotated 360 degrees about axis 108. Thus, in FIG. 3D, magnetic foil 104 is attached around a circumference of imaging cylinder 102 and retained in part by the suction drawn through vacuum grooves 202 and on one end by the clamping device 106.

In FIG. 3E, a remaining edge of magnetic foil 104 is positioned under trailing edge 208 of clamping device 106, and trailing edge 208 is closed. Thus, a combination of clamping device 106 and suction may secure magnetic foil 104 to imaging cylinder 102. When drum apparatus 100 is configured with magnetic foil 104, drum apparatus 100 may now be used to mount at least one metal back plate 402 via magnetic coupling to magnetic foil 104, as described further below with respect to FIGS. 5A-5D.

Although not shown in FIGS. 3A-3E, imaging cylinder 102 may include additional register pins 302 proximate trailing edge 208 of clamping device 208, with corresponding apertures 304 in magnetic foil 104 being engaged in the additional register pins. While not limited to any particular clamping or registration system, an exemplary embodiment of the invention may comprise the registration system described in U.S. Provisional Patent Application Ser. No. 61/639,694 filed 27-APR-2012, titled METHOD AND APPARATUS TO POSITION AND ALIGN PREPUNCHED PRINTING PLATES ON AN IMAGING CYLINDER, by the present inventor and assigned to the present assignee [ESKO Docket No. ESKO-071P].

In embodiments in which the magnetic foil 104 is configured to be temporarily attached to imaging cylinder 102, magnetic foil 104 may be removed from imaging cylinder 102 via opening of clamping device 106, enabling drum apparatus 100 to again accept flexographic plates 204 (FIG. 2A).

In another exemplary embodiment, magnetic foil 104 may be adhered to imaging cylinder 102 (in addition to or in the absence of clamping device 106), such as with an adhesive. Magnetic foil 104 may be temporarily or permanently adhered to imaging cylinder 102.

Referring next to FIG. 4, an isometric view diagram of an exemplary metal back plate 402 is shown. Metal back plate 402 comprises metal base layer 404, Laser Ablation Mask System (LAMS) coating 408 and photopolymer layer 406 between base layer 404 and LAMS coating 408. Base layer 404 may include any suitable metal material capable of being magnetically coupled to the magnetic foil, such as steel.

Metal back plate 402 may include register punches 410 (i.e., apertures). As described further below with respect to FIGS. 5A-5D, punches 410 may be used to align plate 402 on drum apparatus 100. In general, metal base layer 404 of metal back plate 402 is magnetically coupled to magnetic foil 104, as shown in FIG. 5C.

Figure 5B:
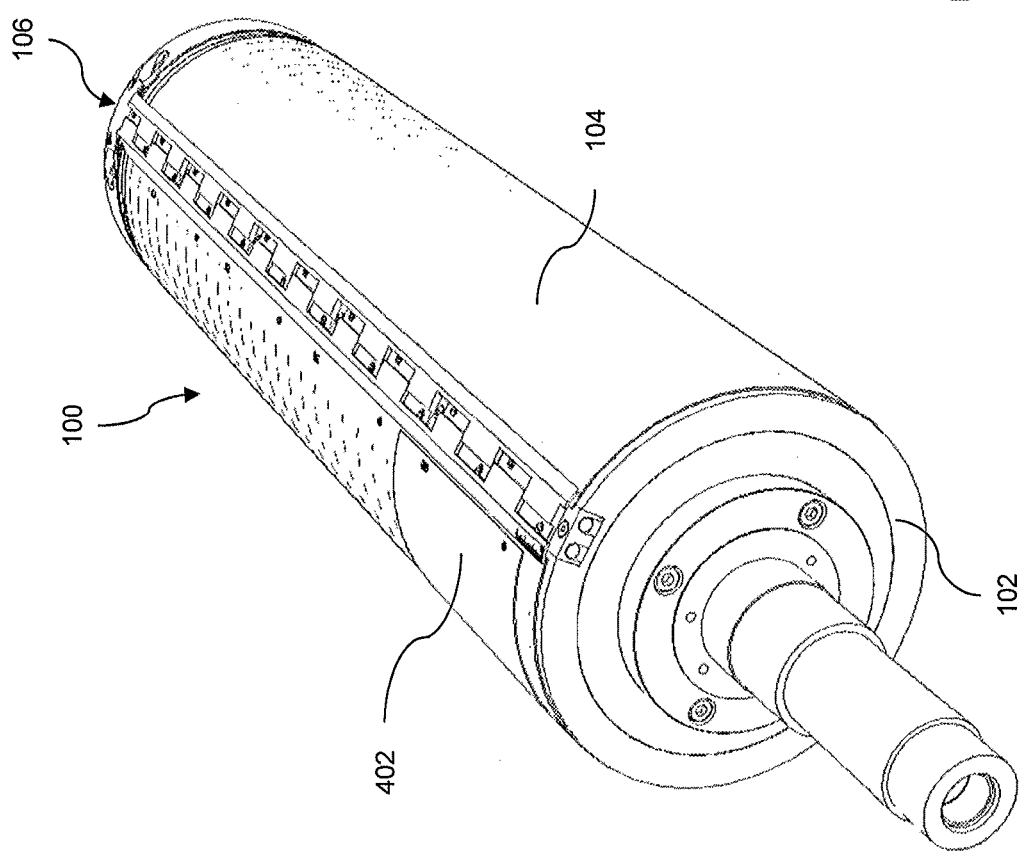
Figure 5D:
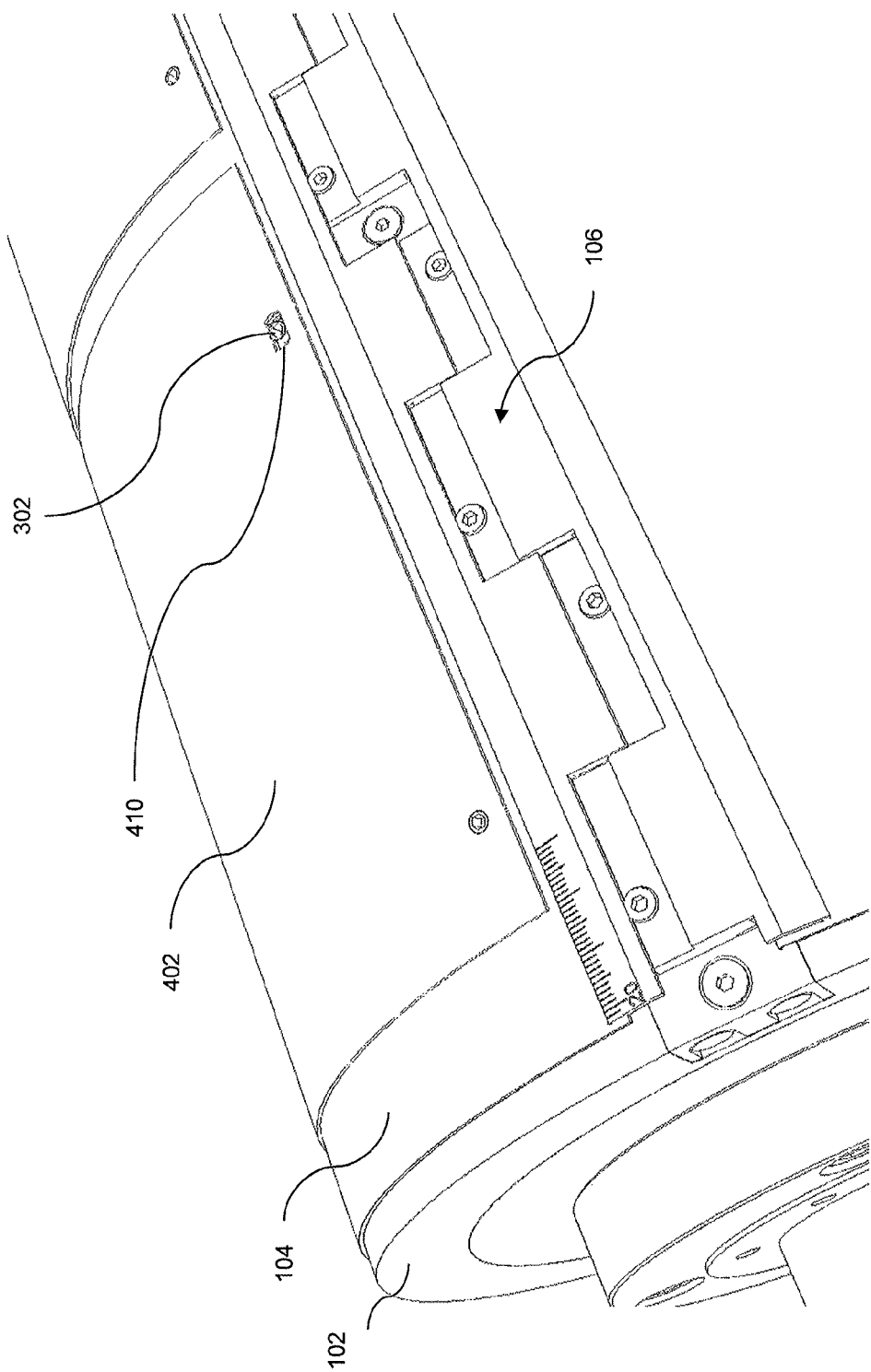
FIG. 5D is a partial top view diagram of the exemplary drum apparatus shown in FIG. 5C, according to aspects of the present invention.

Referring to FIGS. 5A-5D, an exemplary method of attaching one or more metal back plates 402 onto drum apparatus 100 is shown. In particular, FIGS. 5A-5C are isometric view diagrams depicting one or more metal back plates 402 and drum apparatus 100; and FIG. 5D is a partial top view close up diagram of a portion of the drum apparatus 100 of FIG. 5C having attached metal back plates 402.

As shown in FIGS. 5A and 5D, an edge of metal back plate 402 may be aligned and positioned on magnetic foil 104 (which is attached to imaging cylinder 102) by engaging register punches 410 in register pins 302.

As shown in FIG. 5B, a remaining portion of metal back plate 402 is positioned against imaging cylinder 102, and held in position by magnetic coupling between metal back plate 402 (i.e., metal base layer 404 shown in FIG. 4) and magnetic foil 104. Thus, metal back plate 402 is removably attached to imaging cylinder 102 via magnetic foil 104.

As shown in FIG. 5C, a plurality of metal back plates 402 may be similarly attached to drum apparatus 100. Although FIG. 5C illustrates metal back plates 402 of similar sizes, metal back plates 402 may be of different sizes. Although FIGS. 5A-5D illustrate register pins 302 having similar circumferential locations on imaging cylinder 102, some register pins 302 may be at different circumferential locations on imaging cylinder 102, so that different metal back plates 402 may be at different circumferential locations on imaging cylinder 102.

Although FIG. 5C illustrates a plurality of metal back plates 402, a single metal back plate 402 may be attached to drum apparatus 100, for example a full format-sized metal back plate (similar to flexographic plate 204 shown in FIG. 2E) may be attached to drum apparatus 100.

Figure 6A:
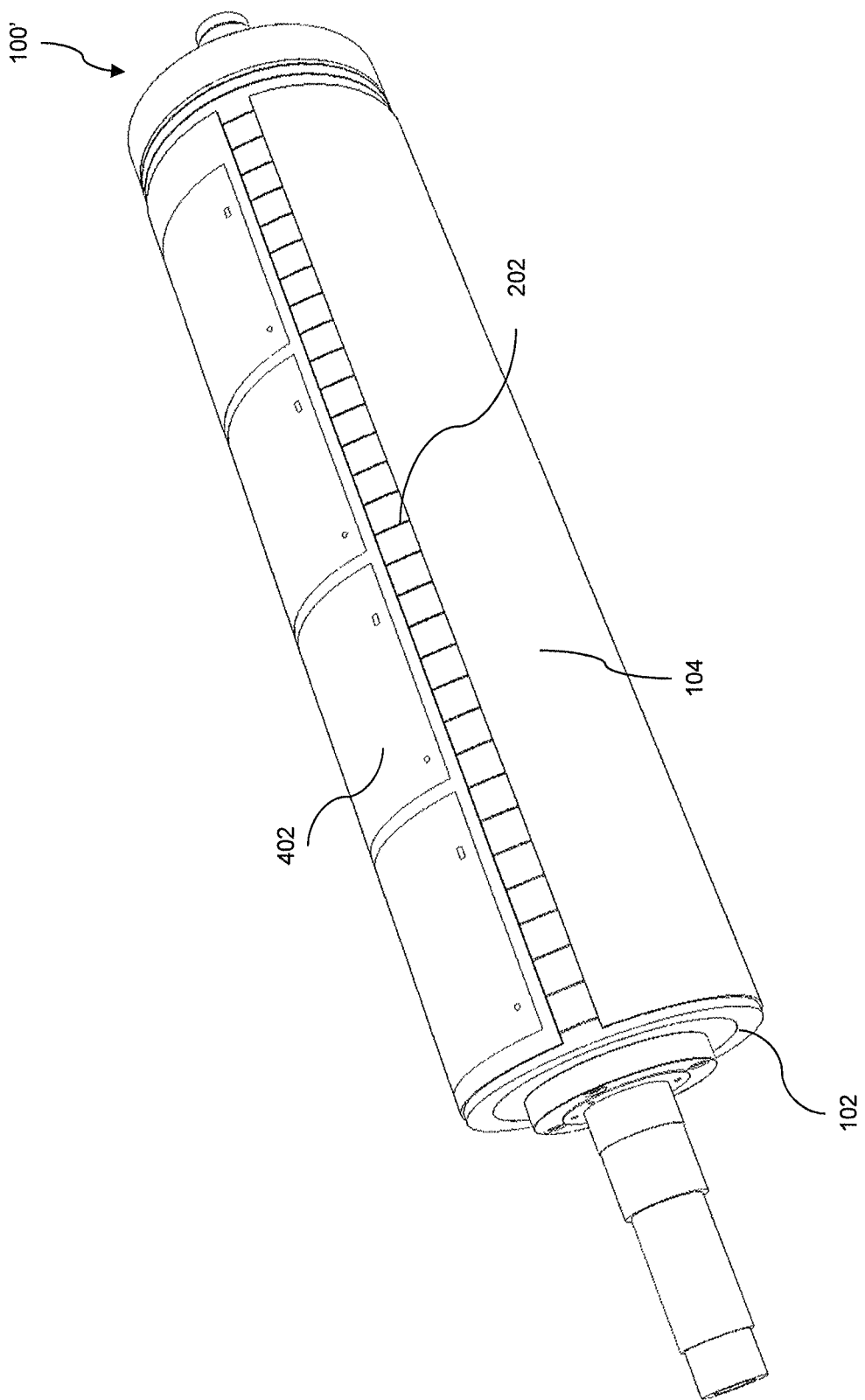
FIG. 6A is an isometric view diagram of an exemplary drum apparatus having a plurality of attached metal back plates, according to additional aspects of the present invention.
Figure 6B:
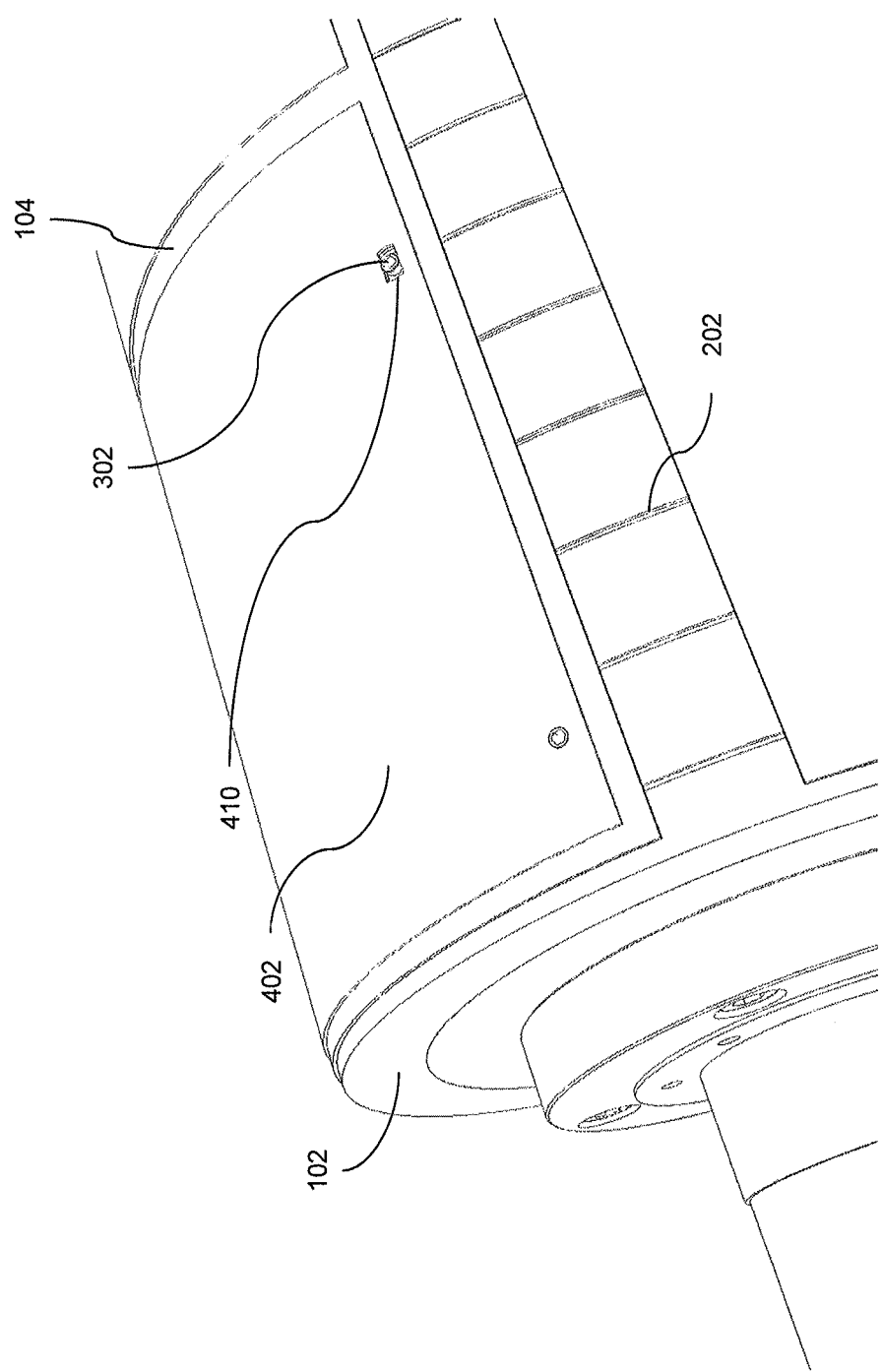
FIG. 6B is a partial top view diagram of the exemplary drum apparatus shown in FIG. 6A, according to aspects of the present invention.

Referring to FIGS. 6A and 6B, exemplary drum apparatus 100' having a plurality of attached plates 402 is shown, according to another aspect of the present invention. In particular, FIG. 6A is an isometric view diagram of drum apparatus 100'; and FIG. 6B is a partial top view diagram of drum apparatus 100'.

Drum apparatus 100' is similar to drum apparatus 100 (shown in FIGS. 5A and 5B), except that drum apparatus 100' does not include clamping device 106. Instead, as discussed above, magnetic foil 104 may be adhesively attached (either temporarily or permanently) to imaging cylinder 102. Drum apparatus 100' may be suitable for retrofitting existing image cylinders 102, for example, that do not have a clamping device 106.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An imaging system configured or retrofitted to accept both ferromagnetic back plates and non-ferromagnetic flexographic plates, the imaging system comprising:
    a non-magnetic imaging cylinder having an outer surface;
    a vacuum system coupled to the imaging cylinder configured to apply a suction through perforations in the outer surface of the imaging cylinder, and
    a flexible magnetic foil having an inner surface and an outer surface;
    the imaging system having:
    a first configuration in which the imaging cylinder is configured or retrofitted to accept the ferromagnetic back plate in which the inner surface of the magnetic foil is releasable and exclusively non-magnetically coupled directly to and in contact with the outer surface of the imaging cylinder including via a coupling force transmitted by the vacuum system suction through the perforations in the imaging cylinder, and the at least one ferromagnetic metal back plate is retained on the imaging cylinder via magnetic coupling directly to and in contact with the outer surface of the magnetic foil, the magnetic foil devoid of perforations except for one or more optional apertures for receiving members of an optional registration system and devoid of any perforations configured to transmit suction from the perforations in the outer surface of the imaging cylinder to an outer surface of the magnetic foil, and
    a second configuration in which the imaging cylinder is not configured or retrofitted to accept the ferromagnetic back plate, in which the magnetic foil is not coupled to the outer surface of the imaging cylinder, wherein at least one non-ferromagnetic flexographic plate is non-magnetically coupled directly to and in contact with the outer surface of the imaging cylinder including via the coupling force transmitted by the vacuum system suction through the perforations in the imaging cylinder.

2. The imaging system of claim 1, further comprising a clamping device coupled to the imaging cylinder operable to releasably clamp the magnetic foil or the at least one flexographic plate to the outer surface of the imaging cylinder.

3. The imaging system of claim 1, wherein the imaging cylinder includes a plurality of register pins extending from the outer surface, the plurality of register pins configured to align the at least one metal back plate on the outer surface of the imaging cylinder.

4. The imaging system of claim 1, wherein the magnetic foil has a length in an axial direction of the imaging cylinder less than a full axial length of the imaging cylinder.

5. The imaging system of claim 1, wherein the magnetic foil has a length in an axial direction of the imaging cylinder substantially equal to a full axial length of the imaging cylinder.

6. The imaging system of claim 1, wherein the magnetic foil comprises a plurality of magnetic foil sheets attachable to the outer surface of the imaging cylinder.

7. The drum apparatus of claim 1, wherein the magnetic foil has a thickness in a range of 0.5 mm to 5 mm.

8. The drum apparatus of claim 7, wherein the magnetic foil has a thickness in a range of 1 mm to 2 mm.

9. The drum apparatus of claim 1, wherein the magnetic foil is sufficiently flexible to have a substantially planar configuration prior to mounting on the imaging cylinder and to conform to a circumference of the outer surface of the imaging cylinder after mounting thereon.

10. The drum apparatus of claim 1, wherein the magnetic foil is sufficiently flexible to have a first curvature with a first radius of curvature prior to mounting on the imaging cylinder and to conform to a circumference of the outer surface of imaging cylinder after mounting thereon, wherein the first radius of curvature is larger than the radius of curvature adopted by the magnetic foil to conform to the circumference of the outer surface of the imaging cylinder.

11. The drum apparatus of claim 1, wherein in the first configuration the at least one ferromagnetic metal back plate is in contact with the outer surface of the magnetic foil along an entire inner surface area of the at least one ferromagnetic metal back plate.

12. A method of retrofitting a non-magnetic vacuum drum imaging cylinder to receive at least one ferromagnetic metal back plate, the method comprising the steps of:
   (a) providing the non-magnetic vacuum drum imaging cylinder having a plurality of perforations in the outer surface of the imaging cylinder and a source of vacuum connected to the imaging cylinder for creating a suction through each of the perforations,
   (b) retrofitting the non-magnetic vacuum drum imaging cylinder to receive the at least one ferromagnetic metal back plate by releasably non-magnetically coupling a flexible magnetic foil directly to and in contact with an outer surface of the imaging cylinder at least in part using the suction through the perforations, and in no part by magnetic coupling, the magnetic foil devoid of perforations except for one or more optional apertures for receiving members of an optional registration system and devoid of any perforations configured to transmit suction from the perforations in the outer surface of the imaging cylinder to an outer surface of the magnetic foil; and
   (c) magnetically coupling the at least one ferromagnetic metal back plate directly to and in contact with the magnetic foil on the imaging cylinder.

13. The method of claim 12, wherein the step of attaching the magnetic foil comprises clamping the magnetic foil to the outer surface of the imaging cylinder via a clamping device.

14. The method of claim 12, wherein the imaging cylinder further comprises a plurality of register pins extending from the outer surface and the step of attaching the magnetic foil includes aligning the magnetic foil in a desired position on the imaging cylinder using the plurality of register pins.

15. The method of claim 14, wherein the step of magnetically coupling the at least one ferromagnetic metal back plate includes aligning the at least one ferromagnetic metal back plate in a desired position on the imaging cylinder using the plurality of register pins.

16. The method of claim 12, wherein the step of magnetically coupling comprises magnetically coupling a plurality of ferromagnetic metal back plates to the foil.

17. The method of claim 12, further comprising the steps of:
   (c) detaching the magnetic foil from the outer surface of the imaging cylinder; and
   (d) coupling at least one flexo plate to the imaging cylinder.

18. A method of retrofitting a non-magnetic vacuum drum imaging cylinder to receive at least one ferromagnetic metal back plate, the method comprising the steps of:
   (a) providing the non-magnetic vacuum drum imaging cylinder having a plurality of perforations in the outer surface of the imaging cylinder and a source of vacuum connected to the imaging cylinder for creating a suction through each of the perforations,
   (b) retrofitting the non-magnetic vacuum drum imaging cylinder to receive the at least one ferromagnetic metal back plate by attaching a flexible magnetic foil directly to an outer surface of the imaging cylinder at least in part via an adhesive layer and at least in part using the suction transmitted through the perforations, and in no part by magnetic coupling, said adhesive layer disposed directly on and in contact with the outer surface of the imaging cylinder and directly on and in contact with the flexible magnetic foil, the magnetic foil devoid of perforations except for one or more optional apertures for receiving members of an optional registration system and devoid of any perforations configured to transmit suction from the perforations in the outer surface of the imaging cylinder to an outer surface of the magnetic foil; and
   (c) magnetically coupling the at least one ferromagnetic metal back plate directly to and in contact with the magnetic foil on the imaging cylinder.

19. The method of claim 18, further comprising clamping a first edge of the magnetic foil to the outer surface of the imaging cylinder using a leading edge of a clamping device, disposing the foil around a circumference of the imaging cylinder and clamping a second edge of magnetic foil to the outer surface of the imaging cylinder using a trailing edge of the clamping device.

* * * * *